(12) United States Patent
Lou et al.

(10) Patent No.: US 6,200,852 B1
(45) Date of Patent: Mar. 13, 2001

(54) METHOD TO FABRICATE DRAM CAPACITOR

(75) Inventors: Chine-Gie Lou, Hsinchu Hsien; Min-Hwa Chi, Hsinchu, both of (TW)

(73) Assignee: Worldwide Semiconductor Manufacturing Corp., Hsinchu (TW)

(*) Notice: Subject to any disclaimer, the term of this patent is extended or adjusted under 35 U.S.C. 154(b) by 0 days.

(21) Appl. No.: 09/393,705

(22) Filed: Sep. 10, 1999

(30) Foreign Application Priority Data

Aug. 2, 1999 (TW) .................................. 88113183

(51) Int. Cl.$^7$ .............................................. H01L 21/8242
(52) U.S. Cl. .......................... 438/253; 438/239; 438/240; 438/261; 438/287; 438/386
(58) Field of Search .................................. 438/238–240, 438/243–257, 381, 386–399, 287

(56) References Cited

U.S. PATENT DOCUMENTS

| | | | |
|---|---|---|---|
| 5,250,456 | * | 10/1993 | Bryant .................................. 438/253 |
| 5,661,056 | * | 8/1997 | Takeuchi .............................. 438/261 |
| 5,714,399 | * | 2/1998 | Hisatomi et al. .................... 438/261 |
| 6,020,238 | * | 2/2000 | He et al. .............................. 438/261 |

OTHER PUBLICATIONS

Mori et al, "bootom–Oxide scaling for thin nitride/oxide interpoly dielectric in stacked–gate nonviolateile memory cells"vol39. No.2, pp283–291*

* cited by examiner

*Primary Examiner*—Charles Bowers
*Assistant Examiner*—Thanh Nguyen

(57) ABSTRACT

A method for fabricating DRAM capacitor dielectric layer with high permittivity is disclosed. In the first preferred embodiment, the process temperature is about 700° C. or below. Thus this embodiment is apt to utilize for DRAM with metal silicide transistor. In the processes, the multiple thin silicon nitride layers are formed on respective film surface to obtain pinhole defects unmatched dielectric layer. The second preferred embodiment, the processes uses different CVD method to deposit multiple thin silicon nitride layers and thus pinhole defects are unmatched. Both of two embodiments provide capacitor dielectric layer with least leakage current so as to increase the capacitance.

17 Claims, 2 Drawing Sheets

US 6,200,852 B1

METHOD TO FABRICATE DRAM CAPACITOR

FIELD OF THE INVENTION

The present invention relates to a semiconductor memory process, and more specifically, to a method of fabricating DRAM capacitors using multiple thin silicon nitride layers as the capacitor dielectric layer.

BACKGROUND OF THE INVENTION

The computer and electronics industry demand of increasing its whole speed performance as well as its cost down for fabricating integrated circuits. As far as a computer is concern, it is without doubting that the DRAM integrated circuits plays a crucial role because it is used by a large number and it plays a vital factor for determining the I/O speed in a computer. Hence, pursuing the miniaturization of the DRAM device as well as high-speed performance are almost the ultimate goals.

For pursuing high-speed requirement, the DRAM cell's storage capacity is an important factor to be considered. The capacitor is formed with a storage node, a cell plate, and an intervening dielectric layer. Thus the storage capacity could be increased by making the capacitor dielectric layer thinner, by using an insulator with a large r dielectric constant, or by increasing the area of the capacitor. The first two options are not viable, since capacitor dielectric layers thinner than those now being used in DRAM cells will suffer leakage current due to Fowler-Nordheim tunneling. Moreover, it will also deteriorate the oxidation resist. However, the suffering from a higher leakage current for using a larger dielectric constant layer is being reported in some research. Thus, most approach is by means of increasing the surface area of the bottom cell plate. For instance, the crown-shaped capacitor or fin shaped capacitor or the cylindrical shaped capacitor so as to increase the capacitance. The integrity of about 256M or 1 Giga bytes DRAM capacitor in a chip, the present design rule is, however, can not be satisfied when utilizes merely by increasing the surface area of the bottom cell plate. The lithographic and etching issues are suffered due to the high aspect ratio of the contact hole.

Thus, improving the effective dielectric constant of the capacitor dielectric layer without the leakage current issue to obtain the large capacitance may be the best approach to alleviate the burden of the lithographic and etching technique The present invention provides such a method.

SUMMARY OF THE INVENTION

A method is disclosed for fabricating a DRAM cell, which has a capacitor dielectric layer with a high dielectric constant. The method improves the qualities of the capacitor dielectric layer, for example the pinhole defects in the silicon nitride layer is unmatched. In the first preferred embodiment, the steps are as follows: at first, a semiconductor substrate having a DRAM transistor thereon and a bottom plate of the DRAM capacitor formed of polysilicon is prepared. Before loading the LPCVD chamber, a native oxide layer on the semiconductor substrate is removed using dilute HF solution. Thereafter, a first ammonium treatment is performed so as to form a first oxynitride layer. Subsequently, a first silicon nitride layer formed on the first oxynitride layer is followed. After a first HTO layer formed on the first silicon nitride layer, a second ammonium treatment is done so as to transform the first HTO layer into a second oxynitride layer. A second silicon nitride layer is then formed on the second oxynitride layer. A second HTO layer formed on the second silicon nitride layer is followed. Thereafter, a third ammonium treatment is performed so as to transform the second HTO layer into a third oxynitride layer. Finally, forming a polysilicon layer on the third oxynitride layer is done. The polysilicon layer is then patterned to be a top plate of the DRAM capacitor.

The second preferred embodiment provides the processes similar to the first preferred embodiment before depositing a third silicon nitride layer. However, the processing temperatures allowed are higher than those of operating in the first preferred embodiment. The semiconductor substrate is then transferred into a PECVD chamber to form a third silicon nitride layer on the second silicon nitride layer. An oxide layer formed on the third silicon nitride layer is followed. Subsequently, a third ammonium treatment is done so as to transform the oxide layer into a third oxynitride layer. Finally, as before, a polysilicon layer is formed and patterned on the third oxynitride layer for serving as the top plate of the DRAM capacitor.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENT

As depicted in the forgoing prior art, the storage capacitance increased if the processes are achieved by growing toward up spatial direction will suffer from the lithography techniques and etching issues. On the other hand the dielectric material with high permittivity usually led to high leakage current which needs to be improved, specifically, to the embedded DRAM, which demanded strictly low leakage current.

Figure 1:
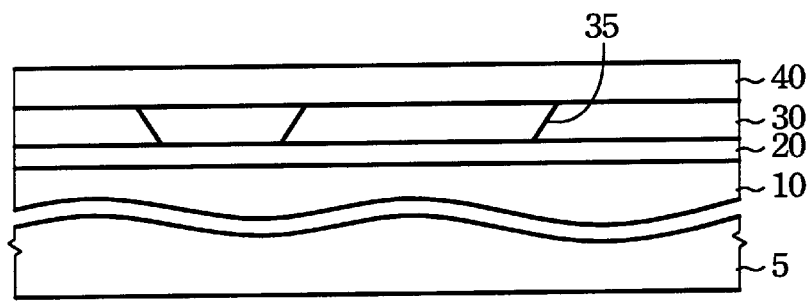
FIG. 1 to FIG. 3 illustrating the processes for forming a DRAM cell in accordance with a first preferred embodiment of the present invention.
Figure 2:
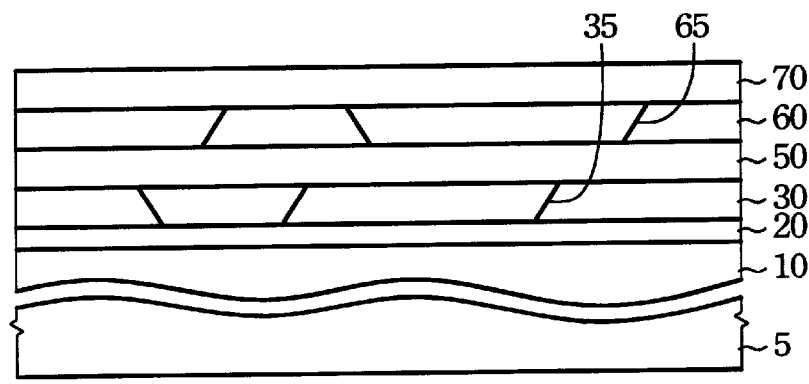
Figure 3:
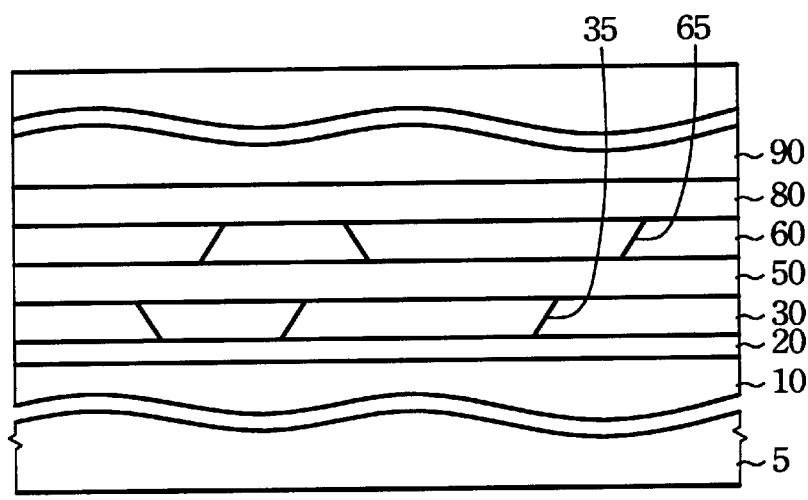

The silicon nitride has permittivity up to 7, and thus it has attracted much attention. However, the silicon nitride is not apt to directly act as the capacitor dielectric material because the defects, such as the pinholes are generally found in the intervening dielectric layer. The defects are observed to be continuous from the top plate of the capacitor to the bottom plate of the capacitor, which generates fast paths for the carrier, as a consequence, a significantly leakage current will introduce The present invention proposes a method to overcome those issues. Two preferred embodiments are depicted in detailed as follows:

The first preferred embodiment is illustrated in FIG. 1 to FIG. 3. Please refer to FIG. 1, a DRAM transistor (not shown) and a bottom plate 10 of the capacitor formed by a conventional method thereon a semiconductor substrate 5 are prepared. The semiconductor substrate 5 is then cleaned by using dilute HF or BOE solution to remove the native oxide layer. Thereafter, the semiconductor substrate 5 is then brought into the fast temperature elevated and chilling (FTEC) low pressure chemical vapor deposition chamber (LPCVD) for performing a first ammonium treatment so that the residual or newly formed native oxide will transform to a first oxynitride layer 20. Preferably, the first ammonium treatment is under a temperature of about 700° C. or below and a pressure of about 120–200 torr to convert the native oxide to the first oxynitride layer 20.

Subsequently, in the same process chamber, a first silicon nitride layer 30 of about 1.5–2.5 nm in thickness is deposited on the first oxynitride layer 20. Worth to noted that the temperature of deposition is about 600–650° C. and the gases concentration ratio of ammonium/dichlorosilane ($SiCl_2H_2$) is adjusted to about 2:1. For embedded DRAM transistor having metal silicide formed, the postprocess is best lower than 700° C. The numeral number 35 shown in FIG. 1 indicates the pinhole defects.

After that, an in-situ first high temperature oxide (herein and after called HTO) layer 40 of about 10–20 Å is deposited on the first silicon nitride layer 30 using LPCVD method. It is noted that the semiconductor substrate 5 only needs to be transferred from the silicon nitride deposition furnace tube to the HTO deposition furnace tube rather than change the LPCVD system to perform the step. In the first preferred embodiment, the deposition rate is held to about 0.3–2 Å to deposit the HTO layer 40 for assuring the uniformity of the film.

Referring to FIG. 2, an ammonium treatment is carried out at a temperature of about 700° C. or below and a pressure of about 120–200 torr to transform the first HTO layer 40 into a second oxynitride layer 50.

Still referring to FIG. 2, a second silicon nitride layer 60 is deposited on the second oxynitride layer 50. The deposition temperature and the gas concentration ratio of ammonium/dichlorosilane ($SiCl_2H_2$) are adjusted to be the same as before. The second silicon nitride layer 60 is deposited to about 15–25 Å in thickness. The numeral number 65 denotes the pinhole defects.

Subsequently, a second HTO layer 70 of about 10–20 Å is formed on the second silicon nitride layer 60. The composition of the second HTO layer 70 can varied from the silicon rich oxide layer or the general HTO oxide layer.

Please refer to FIG. 3, an ammonium treatment is done as before to transform the second HTO layer 70 into a third oxynitride layer 80.

Still referring to FIG. 3, a polysilicon layer 90 is deposition on the third oxynitride layer 80 and is then patterned as a top plate of the capacitor finally.

Since above twice silicon nitride layer depositions, denoted by 30, 60 are respectively formed on different thin films, two different oxynitride layers 20, 50, and thus the pinhole defects 35, 65 will not match. In the other word, no continuous pinhole defect is formed, as a result lower leakage current is anticipated.

Figure 4:
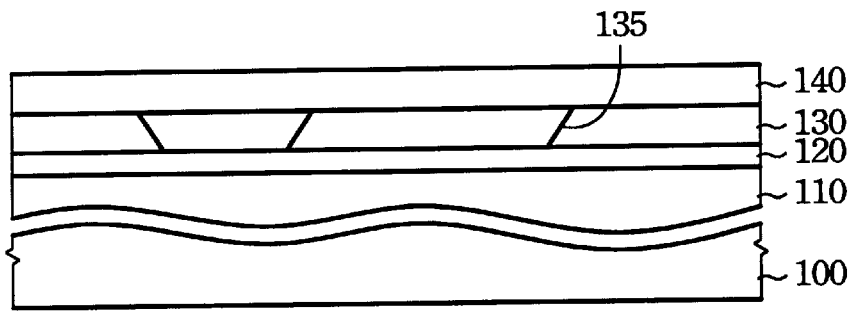
FIG. 4 to FIG. 6 illustrating the processes for forming a DRAM cell in accordance with a second preferred embodiment of the present invention.

The second preferred embodiment provided herein is processed at higher temperature situations. The pinhole defects formed in the silicon nitride can still unmatch so as to reach the purpose of low leakage current. The method are depicted as follows:

Referring to FIG. 4, a DRAM transistor (not shown) and bottom plate 110 of the capacitor formed by a conventional method thereon a semiconductor substrate 100 is provided. The removal of the native oxide layer on the semiconductor substrate 100 is done by using dilute HF or BOE solution before loading into a fast temperature elevated and chilling furnace (FECF) of low pressure chemical vapor deposition chamber (LPCVD). A first ammonium treatment is carried out so that the residual or newly formed native oxide will transform to a first oxynitride layer 120. Preferably, the first ammonium treatment is not restricted below 700° C. in contrast, the treatment is performed at a temperature of about 750–800° C. and a pressure of about 120–150 torr to covert the native oxide of about 15 Å in thickness to the first oxynitride layer 120. Subsequently, in the same process chamber, a first silicon nitride layer 130 of about 1–2.5 nm in thickness is deposited on the first oxynitride layer 120. Noted that the temperature of deposition is about 600–700° C. and the concentration ratio of ammonium/dichlorosilane ($SiCl_2H_2$) is controlled at about 2:1. The numeral number 135 shown in FIG. 4 indicates the pinhole defects.

After that, an in-situ first HTO layer 140 is deposited on the first silicon nitride layer 130 using LPCVD method. In the second preferred embodiment, the deposition rate is held to about 0.3–2 Å/min to deposit the HTO layer 140 up to 10–20 Å at a temperature of about 700–800° C.

Figure 5:
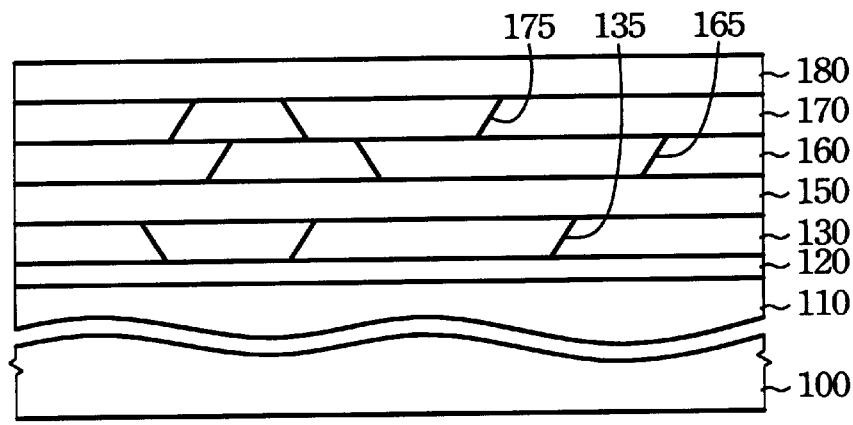

Referring to FIG. 5, the second ammonium treatment is carried out to transform the first HTO layer 140 into a second oxynitride layer 150.

Still referring to FIG. 5, a second silicon nitride layer 160 is deposited on the second oxynitride layer 150. The deposition temperature and the concentration ratio of ammonium/dichlorosilane ($SiCl_2H_2$) are adjusted to be the same as before. The thickness of second silicon nitride layer 160 is about 10–25 Å.

Thereafter, the semiconductor substrate 100 is transferred to PECVD chamber to form a third silicon nitride layer 170. The third silicon nitride layer 170 is formed to about 15–25 Å at a temperature of about 350–500° C. It is noted that this step is optional. However, to enhance the pinhole defect unmatch effect, the step is demanded. The numeral number 165 and 175 denoted in FIG. 5 are the pinhole defects.

A thermal oxidation is then performed to form an oxide layer 180 on the third silicon nitride layer 170. Preferably, the oxidation temperature is about 700–800° C. and the thickness of oxide layer 180 is of about 10–20 Å.

Figure 6:
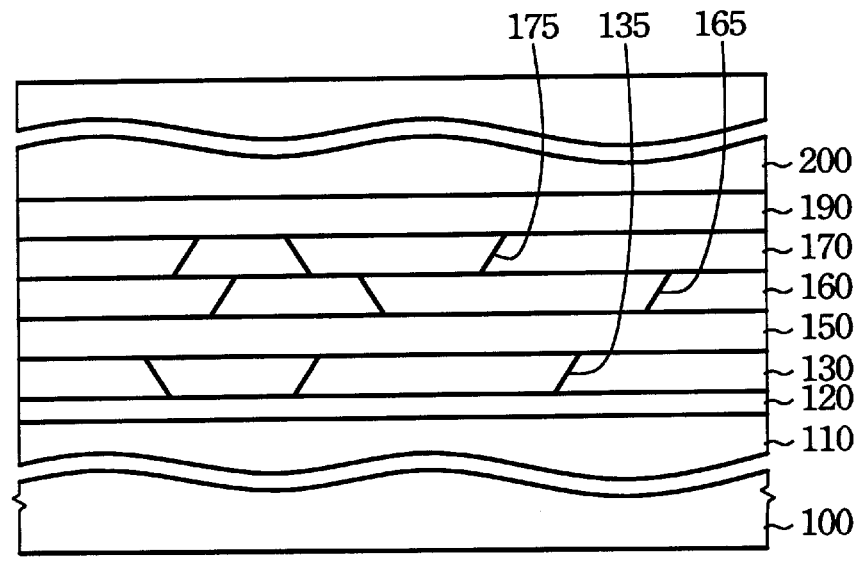

Please refer to FIG. 6, a third ammonium treatment at a temperature of about 750–800° C. is performed so as to transform the oxide layer 180 to a third oxynitride layer 190.

Finally, after forming a polysilicon layer 200 on the third oxynitride layer 190, the polysilicon layer 200 is then being patterned to act as a top plate of the capacitor. In the second preferred embodiment, the ammonium treatment as well as the silicon nitride layer and HTO layer deposited temperature in the LPCVD chamber is higher than those process performed in the first preferred embodiment. Moreover, the second preferred embodiment in terms of two different deposited systems, the LPCVD and PECVD, and thus the pinhole defects in the silicon nitride layers are unmatched. The low leakage current goal can be achieved.

While the preferred embodiment of the invention has been illustrated and described, it will be appreciated that various changes can be made therein without departing from the spirit and scope of the invention.

What is claimed is:

1. A method for fabricating a DRAM capacitor, said method being enable the pinhole defects in the capacitor dielectric layer unmatch, said method comprising the steps of:

provide a semiconductor substrate, said semiconductor substrate having a DRAM transistor thereon and a bottom plate of said DRAM capacitor formed;

removing a native oxide layer on said semiconductor substrate using dilute HF solution;

performing a first ammonium treatment so as to form a first oxynitride layer;

forming a first silicon nitride layer on said first oxynitride layer;

forming a first HTO layer on said first silicon nitride layer;

performing a second ammonium treatment so as to transform said first HTO layer into a second oxynitride layer;

forming a second silicon nitride layer on said second oxynitride layer;

forming a second HTO layer on said second silicon nitride layer;

performing a third ammonium treatment so as to transform said second HTO layer into a third oxynitride layer; and forming a polysilicon layer on said third oxynitride layer for serving as a top plate of said DRAM capacitor.

2. The method of claim 1, wherein said first ammonium treatment is processed at a temperature about 700° C. and/or below, a pressure of about 120–200 torr in a fast temperature elevated and chilling LPCVD chamber.

3. The method of claim 1, wherein said first silicon nitride layer is about 1.5–2.5 nm in thickness, and a concentration ratio of NH3/SiCl$_2$H$_2$ is controlled at 2:1 at a temperature of about 600–650° C.

4. The method of claim 1, wherein said first HTO layer is formed to about 10–20 Å at a temperature of about 650–700° C. by LPCVD method, using a deposited rate of about 0.3–2 Å/min.

5. The method of claim 1, wherein said second ammonium treatment is processed at a temperature about 700° C. and/or below, a pressure of about 120–200 torr in a fast temperature elevated and chilling LPCVD chamber.

6. The method of claim 1, wherein said second silicon nitride layer is about 1.5–2.5 nm in thickness, and a concentration ratio of NH$_3$/SiCl$_2$H$_2$ is controlled to about 2:1 at a temperature of about 600–650° C.

7. The method of claim 1, wherein said second HTO layer is formed to about 10–20 Å at a temperature of about 650–700° C. by LPCVD method, using a deposited rate of about 0.3–2 Å/min.

8. The method of claim 1, wherein said step of third ammonium treatment is processed at a temperature about 700° C. and/or below, a pressure of about 120–200 torr in a fast temperature elevated and chilling LPCVD chamber.

9. A method for fabricating a DRAM capacitor cell, said method being enable the pinhole defects in the capacitor dielectric layer unmatch, said method comprising the steps of:

providing a semiconductor substrate, said semiconductor substrate having a DRAM transistor thereon and a bottom plate of said DRAM capacitor formed;

removing a native oxide layer on said semiconductor substrate using dilute HF solution;

loading in said semiconductor substrate into fast temperature elevated and chilling LPCVD chamber;

performing a first ammonium treatment so as to form a first oxynitride layer;

forming a first silicon nitride layer on said first oxynitride layer;

forming a HTO layer on said first silicon nitride layer;

performing a second ammonium treatment so as to transform said HTO layer into a second oxynitride layer;

forming a second silicon nitride layer on said second oxynitride layer;

transferring said semiconductor substrate into PECVD chamber to form a third silicon nitride layer on said second silicon nitride layer;

forming an oxide layer on said third silicon nitride layer;

performing a third ammonium treatment so as to transform said second oxide layer into a third oxynitride layer; and forming a polysilicon layer on said third oxynitride layer for serving as a top plate of said DRAM capacitor cell.

10. The method of claim 9, wherein said first ammonium treatment is processed at a temperature of about 750–800° C. and/or below, a pressure of about 120–150 torr.

11. The method of claim 9, wherein said first silicon nitride layer is about 1–2.5 nm in thickness, and at a temperature of about 600–700° C.

12. The method of claim 9, wherein said HTO layer is formed to about 10–20 Å at a temperature of about 700–800° C., using a deposited rate of about 0.3–2 Å/min.

13. The method of claim 9, wherein said second ammonium treatment is processed at a temperature of about 750–800° C., a pressure of about 120–150 torr.

14. The method of claim 9, wherein said second silicon nitride layer is about 1–2.5 nm in thickness, and at a temperature of about 600–700° C.

15. The method of claim 9, wherein said third silicon nitride layer is about 1.5–2.5 nm in thickness at a temperature of about 350–500° C.

16. The method of claim 9, wherein said oxide layer is formed by a thermal oxidation method to about 10–20 Å at a temperature of about 700–800° C.

17. The method of claim 1, wherein said step of third ammonium treatment is processed at a temperature of about 750–800° C.

* * * * *